United States Patent
Yang et al.

(10) Patent No.: US 7,294,572 B2
(45) Date of Patent: Nov. 13, 2007

(54) METHOD OF FORMING CONTACT

(75) Inventors: Chao-Lon Yang, Taipei (TW);
Neng-Kuo Chen, Hsinchu (TW);
Teng-Chun Tsai, Hsinchu (TW);
Chien-Chung Huang, Hsinchu (TW);
Shao-Ta Hsu, Tainan (TW)

(73) Assignee: United Microelectronics Corp.,
Hsinchu (TW)

( * ) Notice: Subject to any disclaimer, the term of this patent is extended or adjusted under 35 U.S.C. 154(b) by 0 days.

(21) Appl. No.: 11/164,480

(22) Filed: Nov. 24, 2005

(65) Prior Publication Data
US 2007/0117375 A1    May 24, 2007

(51) Int. Cl.
*H01L 21/44* (2006.01)
(52) U.S. Cl. .............. 438/672; 438/637; 438/638; 438/673
(58) Field of Classification Search .......... 438/631, 438/637–638, 763, 789, 790, 672–673, 618–624
See application file for complete search history.

(56) References Cited

U.S. PATENT DOCUMENTS 5,001,079 A * 3/1991 van Laarhoven et al. ... 438/666
6,423,630 B1 * 7/2002 Catabay et al. ............. 438/624

* cited by examiner

*Primary Examiner*—Dung A. Le
(74) *Attorney, Agent, or Firm*—Jianq Chyun IP Office (57) ABSTRACT

A method of forming a contact is provided. A substrate having at least two conductive devices is provided. A spacing is located between the two conductive devices. A first dielectric layer is formed over the substrate to cover the two conductive devices and the spacing. A seam is formed in the first dielectric layer within the spacing. Then, a portion of the first dielectric layer is removed to form an opening so that the width of the seam is expanded. A second dielectric layer is formed over the first dielectric layer to fill the opening. A portion of the second dielectric layer and a portion of the first dielectric layer within the spacing are removed until a portion of the surface of the substrate is exposed and a contact opening is formed in the location for forming the contact. Finally, conductive material is deposited to fill the contact opening.

16 Claims, 11 Drawing Sheets

METHOD OF FORMING CONTACT

BACKGROUND OF THE INVENTION

1. Field of the Invention

The present invention relates to a method of forming a semiconductor device. More particularly, the present invention relates to a method of forming a contact.

2. Description of the Related Art

In the development of integrated circuits, a device can operate faster at a lower power rating through a reduction in the size of the device. However, the miniaturization of devices has encountered a barrier due to a bottleneck in the fabrication technique and an increase in production cost. As a result, other types of miniaturization techniques have been developed to improve the driving current of devices. One proposed solution to relieve the limit of device miniaturization includes controlling the stress at the channel region of a transistor. Through the application of some stress, the distance between silicon atoms in the silicon crystal is reduced so that the mobility of electrons and holes are increased. Ultimately, the performance of the device is improved.

At present, one method of improving the performance of the device by controlling the channel stress includes forming a silicon nitride layer that serves a contact etching stop layer. The silicon nitride layer provides the necessary stress for increasing the driving current of the device and enhancing the device performance. Nevertheless, the aforesaid method has some problems that are difficult to remove. Thus, the overall performance of the device is still substantially limited.

Figure 1A:
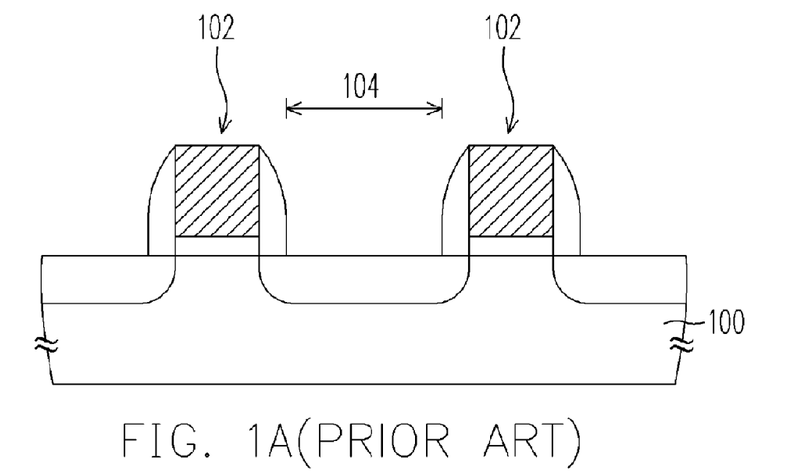
FIGS. 1A through 1E are schematic cross-sectional views showing the conventional method for forming a contact.

FIGS. 1A through 1E are schematic cross-sectional views showing the conventional method for forming a contact. First, as shown in FIG. 1A, a plurality of metal-oxide-semiconductor (MOS) transistors 102 is formed on the substrate 100 such that a spacer 104 is located between two adjacent MOS transistors 102.

Figure 1B:
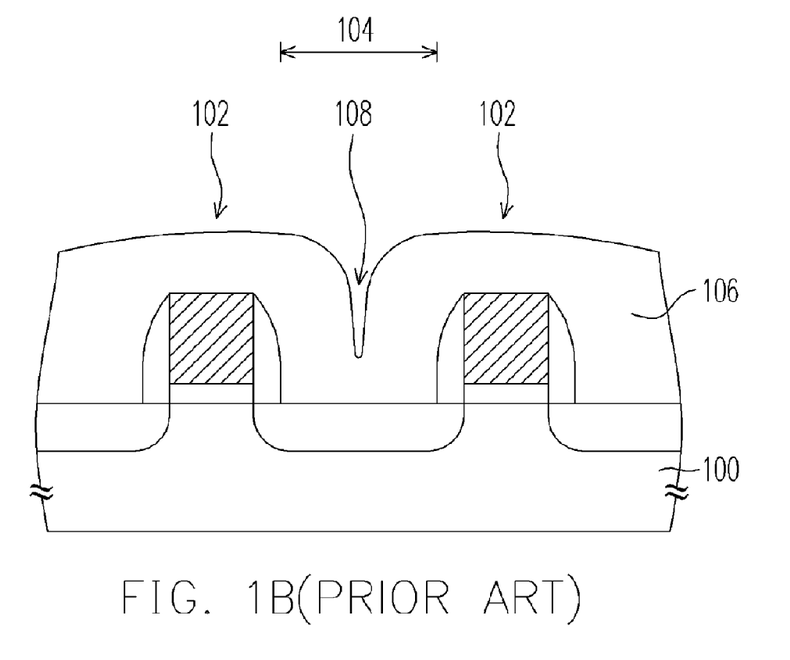

As shown in FIG. 1B, a silicon nitride layer 106 serving as a stress layer is formed over the substrate 100. The silicon nitride layer 106 covers the entire substrate 100 and the MOS transistors 102. Typically, the thickness of the silicon nitride layer 106 is related to the stress value. That is, the thicker the silicon nitride layer 106, the higher will be the stress. Hence, to enhance the performance of the device through thickening the silicon nitride layer, a seam 108 is normally formed in the silicon nitride layer 106 within the spacing 104. The presence of this seam 108 will significantly affect the reliability of subsequent processes.

Figure 1C:
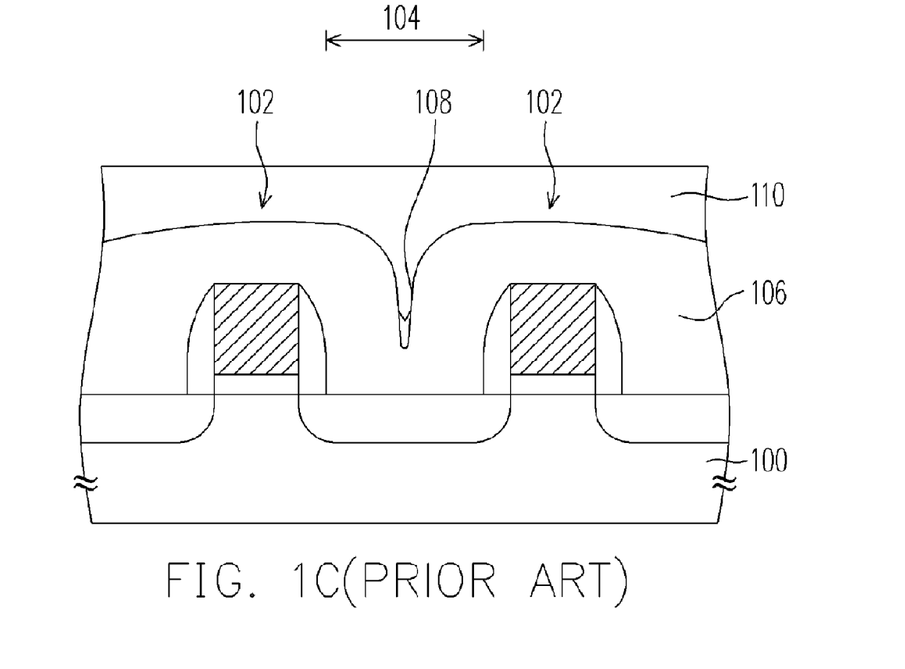
Figure 2:
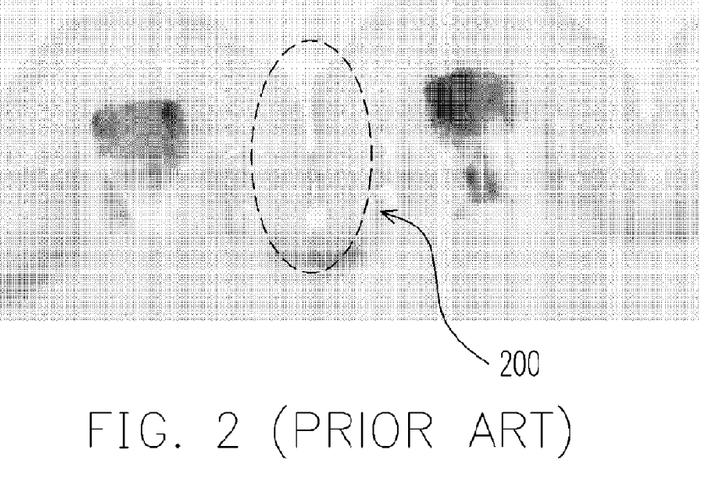
FIG. 2 is an actual photo of a section of the MOS transistors taken using a penetrating electron microscope.

As shown in FIG. 1C, a dielectric layer 110 is formed over the silicon nitride layer 106. Due to the presence of the seam 108, the dielectric layer 110 can hardly cover the silicon nitride layer 106 completely. In other words, the dielectric layer 110 only fills up a portion of the seam 108. FIG. 2 is an actual photo of a section of the MOS transistors taken using a penetrating electron microscope. As shown in the labeled area 200 of FIG. 2, the dielectric layer 110 is unable to fill up the seam 108 in the silicon nitride layer 106 entirely.

Figure 1D:
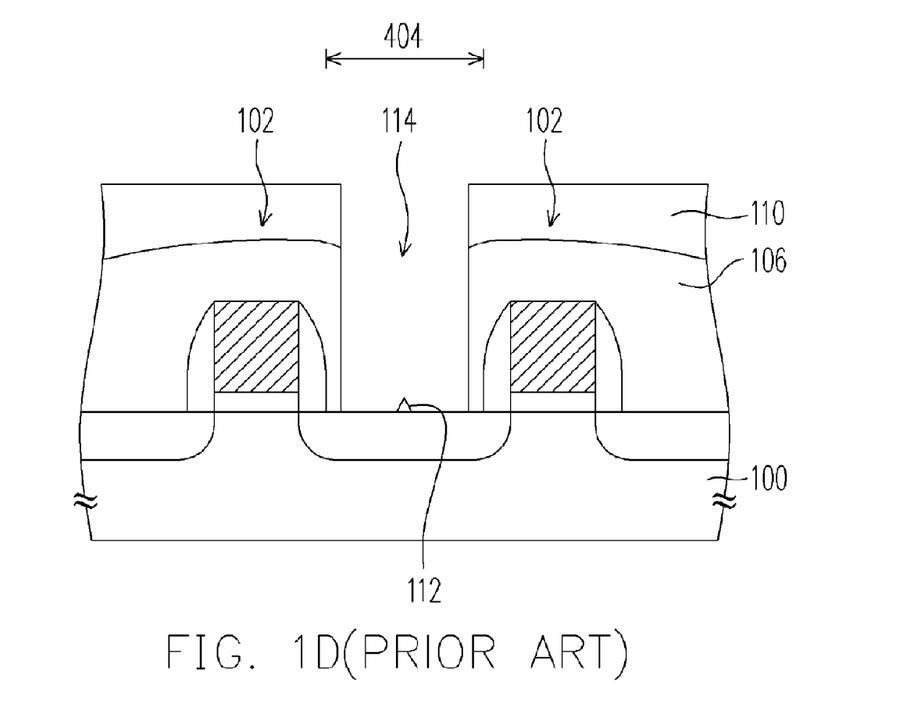
Figure 3:
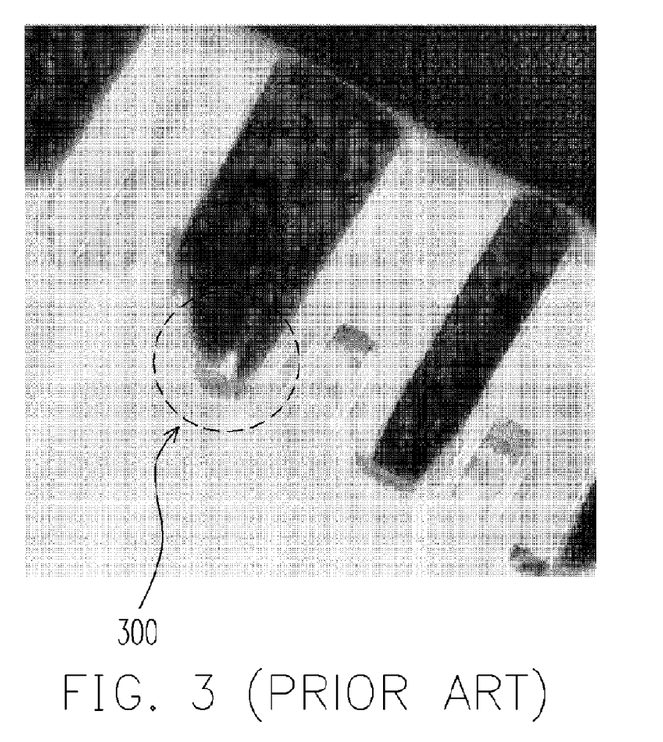
FIG. 3 is another photo of a section of the MOS transistor taken using a penetrating electron microscope.

As shown in FIG. 1D, an etching operation is carried out to form a contact opening 114 in the silicon nitride layer 106 and the dielectric layer 110. It should be noted that some residue 112 is formed at the bottom of the contact opening 114 after the silicon nitride layer 106 and the dielectric layer 110 are etched due to the presence of the seam 108 in the silicon nitride layer 106. FIG. 3 is another photo of a section of the MOS transistor taken using a penetrating electron microscope. The residue is shown within the area labeled 300 of FIG. 3.

Figure 1E:
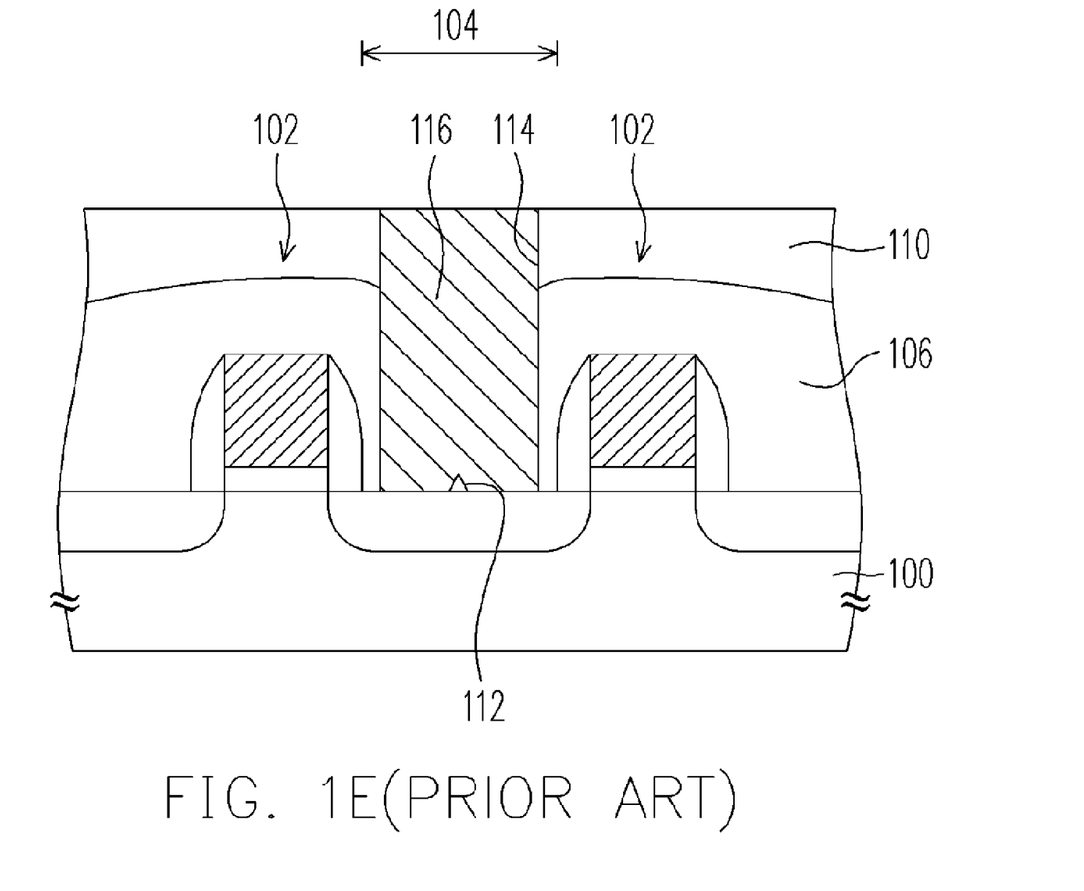

As shown in FIG. 1E, metallic material is deposited into the contact opening 114 to form a metallic material layer and a contact 116. However, the residue 112 at the bottom of the contact opening 114 will increase the resistance of the contact 116 considerably. Sometimes, a short circuit between the contact 116 and the MOS transistor 102 may form resulting in a significant drop in the reliability and performance of the device.

Therefore, a method capable of producing sufficient stress in the silicon nitride layer to enhance device performance and yet capable of preventing the film defects in the silicon nitride layer formed in the manufacturing process from affecting the reliability and performance of the device is a major research topic.

SUMMARY OF THE INVENTION

Accordingly, at least one objective of the present invention is to provide a method of forming a contact that can prevent the degradation of device performance resulting from the formation of residue at the bottom of a contact opening due to the presence of defects in the film layers.

At least another objective of the present invention is to provide a method of forming a contact that can prevent the degradation of device performance due to the formation of defects in the stress layer.

To achieve these and other advantages and in accordance with the purpose of the invention, as embodied and broadly described herein, the invention provides a method of forming a contact. First, a substrate having at least two conductive devices is provided. A spacing is located between the two conductive devices. Then, a first dielectric layer is formed over the substrate to cover the two conductive devices and the spacing. A seam is formed in the first dielectric layer within the spacing. Thereafter, a portion of the first dielectric layer is removed to form an opening so that the width of the seam is expanded. After that, a second dielectric layer is formed over the first dielectric layer to fill the opening. A portion of the second dielectric layer and a portion of the first dielectric layer within the spacing are removed until a portion of the surface of the substrate is exposed so that a contact opening is formed in the location for forming the contact. Finally, conductive material is deposited to fill the contact opening.

According to one embodiment of the present invention, the aforesaid first dielectric layer is a silicon nitride layer, for example. The first dielectric layer has a thickness between about 100 Å to 2000 Å, for example. Preferably, the first dielectric layer has a thickness between about 500 Å to 1500 Å, for example. More preferably, the first dielectric layer has a thickness of about 1000 Å, for example.

According to the embodiment of the present invention, the method of removing a portion of the first dielectric layer in the spacing to form an opening includes forming a photoresist layer over the first dielectric layer. Then, a photolithographic process of the photoresist layer is performed to form a patterned photoresist layer that exposes the seam in the first dielectric layer. Thereafter, using the patterned photoresist layer as an etching mask, a portion of the first dielectric layer is etched to form an opening. Finally, the patterned photoresist layer is removed. In another embodiment, before forming the photoresist layer, a bottom anti-reflective coating layer is formed over the first dielectric layer.

According to the embodiment of the present invention, the material constituting the second dielectric layer includes silicon oxide, phosphosilicate glass, borosilicate glass or undoped silicate glass/phosphosilicate glass, for example.

The present invention also provides another method of forming a contact. First, a substrate is provided. The substrate has at least two metal-oxide-semiconductor (MOS) transistors. A spacing is located between the two MOS transistors. Then, a stress layer is formed over the substrate to cover the two MOS transistors and fill the spacing. A seam is formed in the stress layer within the spacing. Thereafter, a portion of the stress layer in the spacing is removed to form an opening so that the width of the seam is expanded. A portion of the dielectric layer and a portion of the stress layer within the spacing are removed until a portion of the surface of the substrate is exposed so that a contact opening is formed in the location for forming the contact. Finally, conductive material is deposited to fill the contact opening.

According to the method of forming the contact in the embodiment of the present invention, the stress layer includes a silicon nitride layer, for example. The stress level of the stress layer is between 1 to 50 GPa, for example. Preferably, the stress level of the stress layer is between 1 to 10 GPa, for example. In addition, the stress layer has a thickness between about 100 Å to 2000 Å. for example. Preferably, the stress layer has a thickness between about 500 Å to 1500 Å, for example. More preferably, the stress layer has a thickness of about 1000 Å, for example.

According to the method of forming the contact in the embodiment of the present invention, the method of removing a portion of the stress layer in the spacing to form an opening includes forming a photoresist layer over the stress layer. Then, a photolithographic process of the photoresist layer is performed to form a patterned photoresist layer that exposes the seam in the stress layer. Thereafter, using the patterned photoresist layer as an etching mask, a portion of the stress layer is etched to form an opening. Finally, the patterned photoresist layer is removed. In another embodiment, before forming the photoresist layer, a bottom anti-reflective coating layer is formed over the first dielectric layer.

According to the method of forming the contact in the embodiment of the present invention, the material constituting the dielectric layer includes silicon oxide, phosphosilicate glass, borosilicate glass or undoped silicate glass/phosphosilicate glass, for example.

In the present invention, the width of the seam in the first dielectric layer (or the stress layer) is expanded. Thus, residue is prevented from forming at the bottom of the contact opening. Therefore, the resistance of the contact will not increase. Moreover, the drop in the reliability and performance of the device due to short circuit is substantially minimized as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4A:
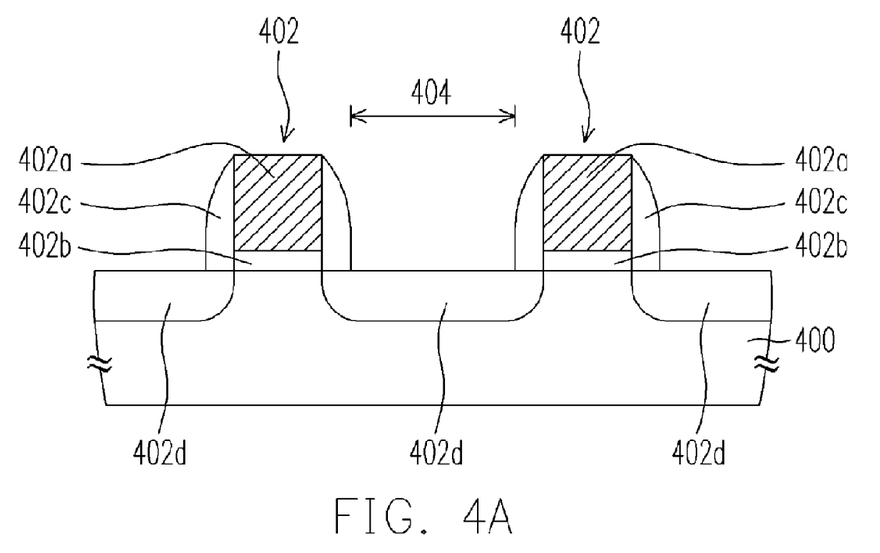
FIGS. 4A through 4F are schematic cross-sectional views showing the method of forming a contact according to one embodiment of the present invention.

FIGS. 4A through 4F are schematic cross-sectional views showing the method of forming a contact according to one embodiment of the present invention. First, as shown in FIG. 4A, a substrate 400 having at least two conductive devices 402 is provided. Furthermore, there is a spacing 404 between two adjacent conductive devices 402. The conductive device 402 can be a metal-oxide-semiconductor (MOS) transistor, for example. Each MOS transistor comprises a gate 402a, a gate dielectric layer 402b, a pair of spacers 402c and a pair of source/drain regions 402d, for example.

Figure 4B:
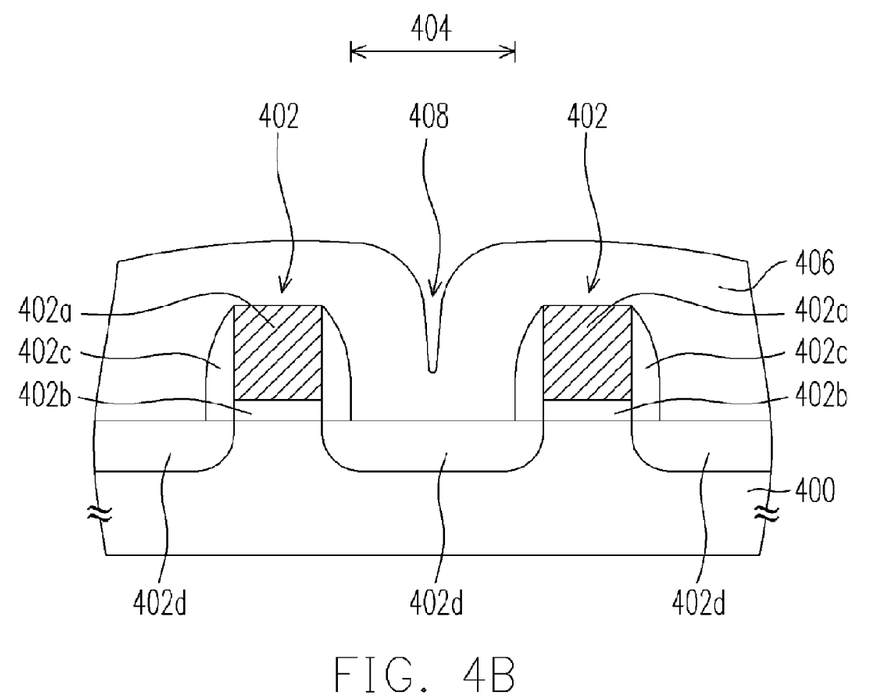

As shown in FIG. 4B, a dielectric layer 406 is formed over the substrate 400. The dielectric layer 406 covers the entire substrate 400 and the conductive devices 402 and fills the spacing 404. The dielectric layer 406 is formed, for example, by performing a chemical vapor deposition process and the material of the dielectric layer 406 is silicon nitride or other suitable dielectric material. Furthermore, the dielectric layer 406 has a thickness between about 100 Å to 2000 Å. Preferably, the dielectric layer 406 has a thickness between about 500 Å to 1500 Å. More preferably, the dielectric layer 406 has a thickness of about 1000 Å. Because the dielectric layer 406 has a relatively large thickness, the dielectric layer 406 between the two adjacent conductive devices 402 within the spacing 404 can easily produce a seam 408 that may affect subsequent processing operations and lead to a drop in the reliability of the device.

Figure 4C:
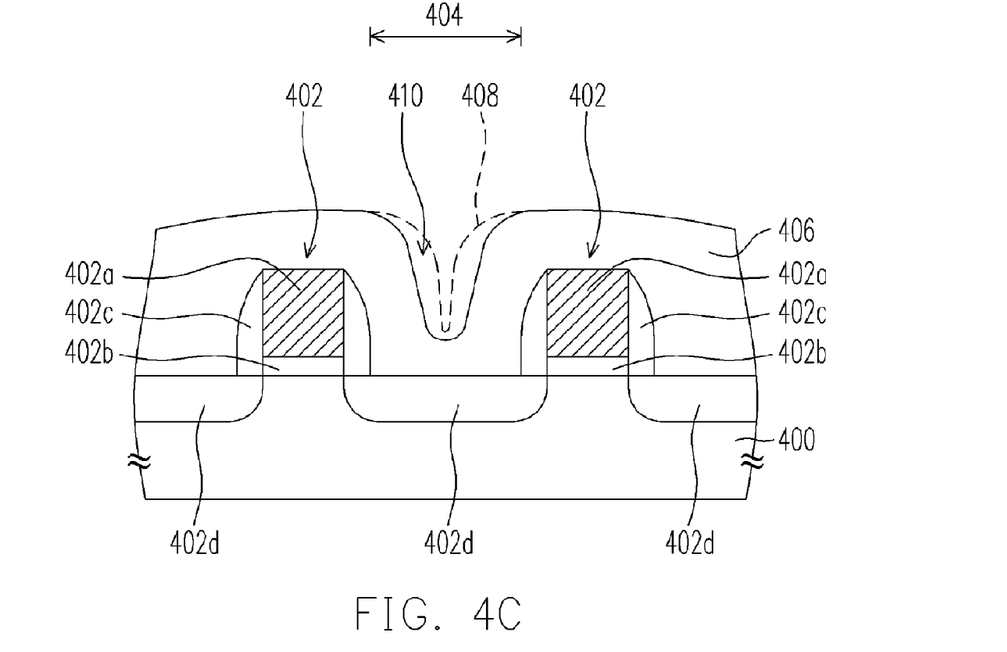

As shown in FIG. 4C, a portion of dielectric layer 406 inside the spacing 404 is removed to form an opening 410 in the dielectric layer 406. The method of forming the opening 410 includes forming a photoresist layer (not shown) over the dielectric layer 406. Then, a photolithographic process is performed on the photoresist layer to produce a patterned photoresist layer 409 that exposes the seam 408 in the dielectric layer 406. Thereafter, using the patterned photoresist layer 409 as an etching mask, a portion of the dielectric layer 406 is etched to form the opening 410. Finally, the patterned photoresist layer 409 is removed.

In another embodiment, a bottom anti-reflective coating layer 407 is formed over the dielectric layer 406 before forming the photoresist layer. The bottom anti-reflective coating layer 407 can provide a smooth surface useful the photolithographic process is performed.

It should be noted that the method of removing a portion of the dielectric layer 406 to form an opening 410 could expand the width of the seam 408 and avoid the problem of a subsequently formed film layer not able to fill the seam 408 completely.

In another embodiment, the method of expanding the width of the seam 408 may include forming a photoresist layer (not shown) over the dielectric layer 406. Then, a photolithographic process is performed on the photoresist layer to produce a patterned photoresist 409 layer that exposes the seam 408 in the dielectric layer 406. Thereafter, using the patterned photoresist layer 409 as an etching mask, a portion of the dielectric layer 406 is etched until expose the surface of the substrate 400 (not shown). Finally, the patterned photoresist layer 409 is removed. Furthermore, before forming the photoresist layer, a bottom anti-reflective coating layer 407 is formed over the dielectric layer 406.

Figure 4D:
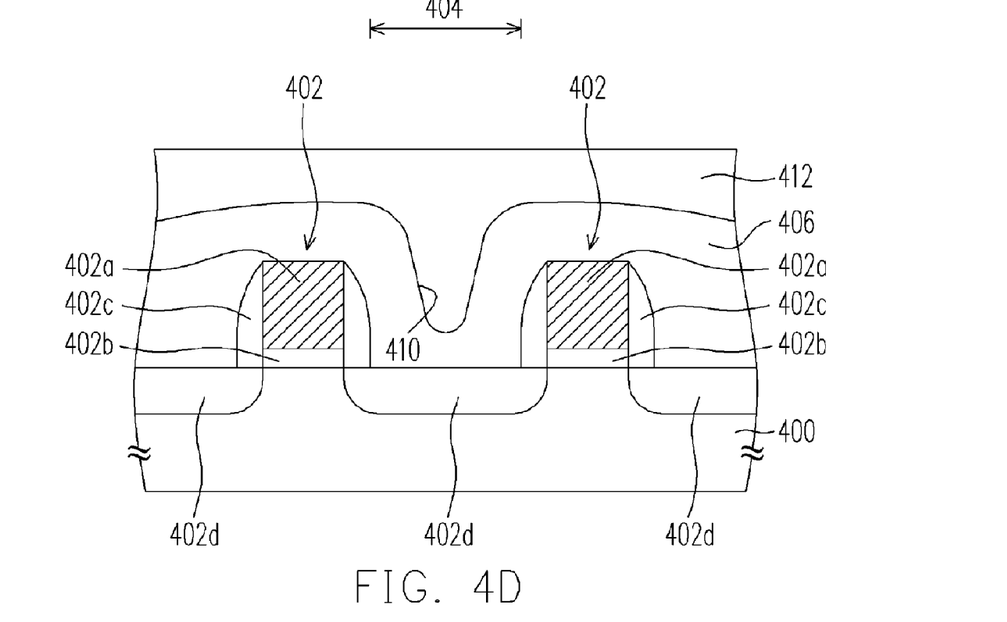

As shown in FIG. 4D, another dielectric layer 412 is formed on the dielectric layer 406 and the dielectric layer 412 completely fills the opening 410. The material of the dielectric layer 412 is silicon oxide, phosphosilicate glass, borosilicate glass or undoped silicate glass/phosphosilicate glass or other suitable dielectric materials, for example. The method of forming the dielectric layer 416 is a chemical vapor deposition process or other suitable processes, for example.

Figure 4E:
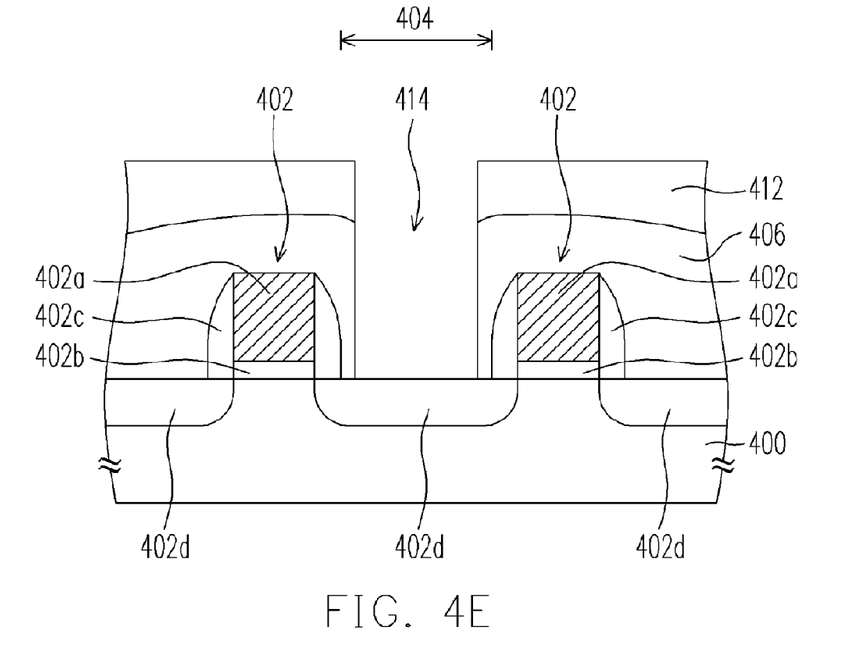

As shown in FIG. 4E, a portion of the dielectric layer 412 and a portion of the dielectric layer 406 within the spacing 404 are removed until a portion of the surface of the substrate 400 is exposed so as to form a contact opening 414 in a location corresponding to the opening 410. The method of forming the contact opening 414 is performing an etching operation, for example.

Figure 4F:
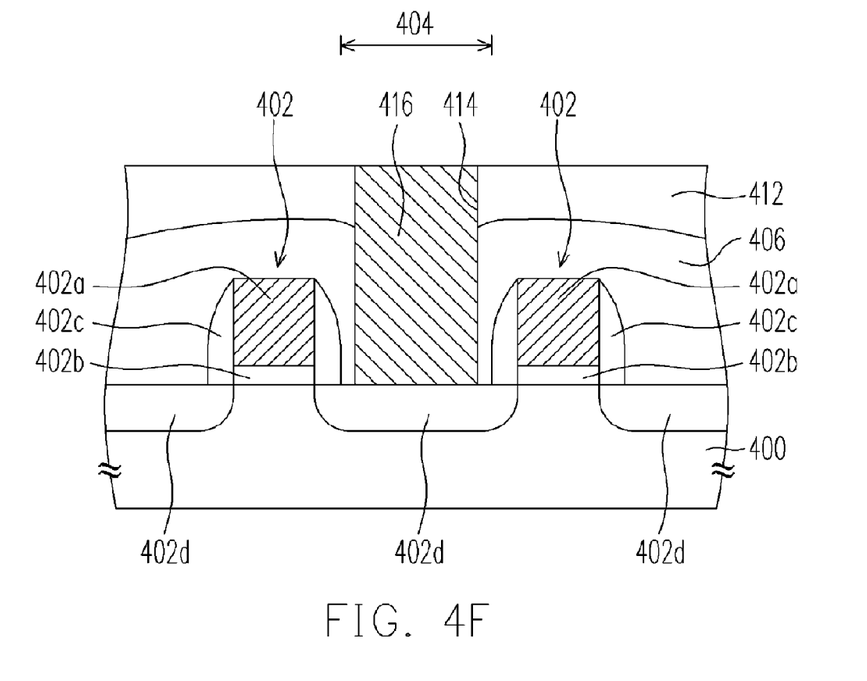

As shown in FIG. 4F, a conductive layer is filled into the contact opening 414 to serve as a contact 416. The material of the aforesaid conductive layer is doped polysilicon, aluminum, copper or tungsten, for example. The conductive layer is formed, for example, by performing a chemical vapor deposition process or other suitable processes.

It should be noted that no residue is formed at the bottom of the contact opening 414 because a portion of the dielectric layer 406 has already been removed to expand the width of the seam 408 before forming the contact opening 414. In other words, the problems of having a higher resistance and an increased chance of developing a short circuit in the device due to the presence of residual material at the bottom of the contact opening 414 can be avoided.

Figure 5A:
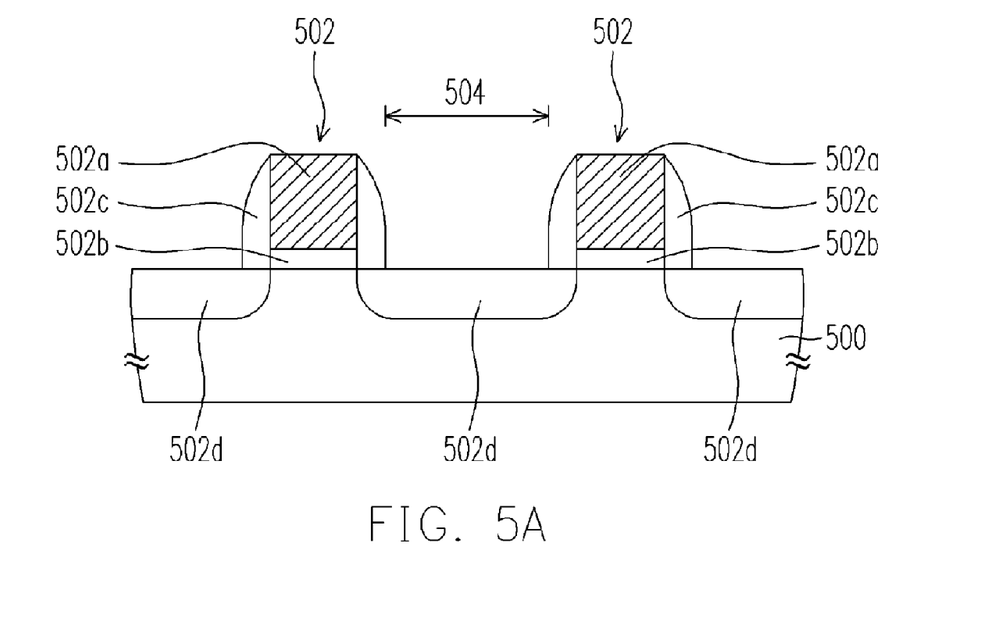
FIGS. 5A through 5F are schematic cross-sectional views showing the method of forming a contact according to one embodiment of the present invention.

FIGS. 5A through 5F are schematic cross-sectional views showing the method of forming a contact according to one embodiment of the present invention. First, as shown in FIG. 5A, a substrate 500 having at least two MOS transistors 502 is provided. Furthermore, there is a spacing 504 between two adjacent MOS transistors 502. Each MOS transistor 502 comprises a gate 502a, a gate dielectric layer 502b, a pair of spacers 502c and a pair of source/drain region 502d.

Figure 5B:
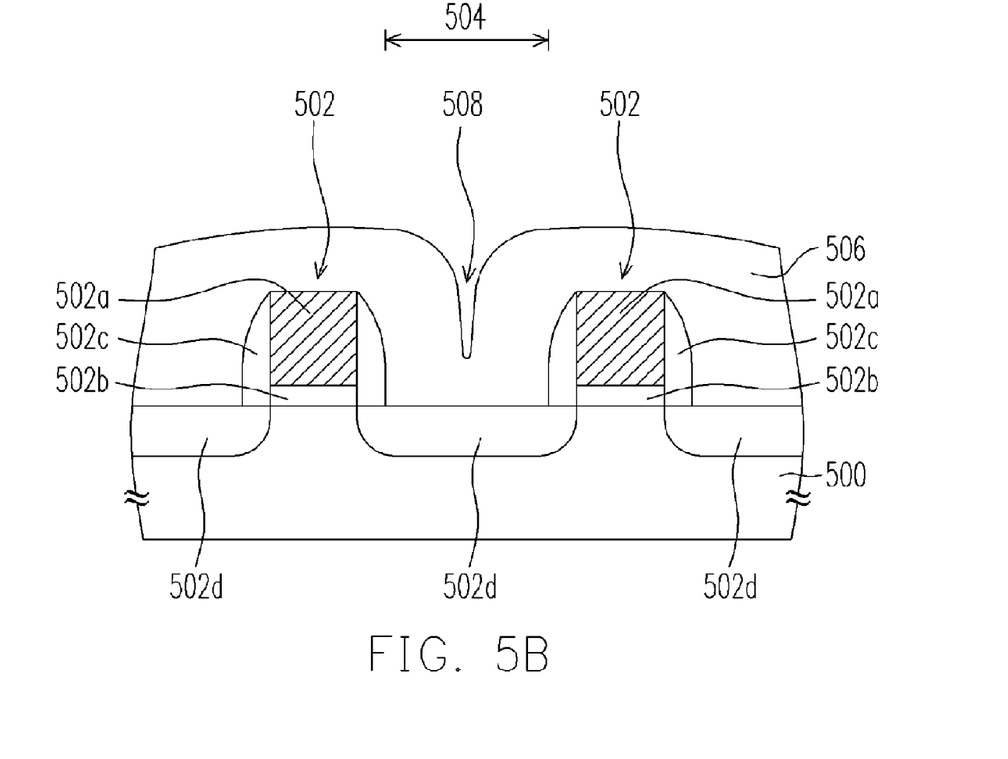

As shown in FIG. 5B, a stress layer 506 is formed over the substrate 500. The stress layer 506 covers the entire substrate 500 and the conductive devices 502 and fills the spacing 504. The stress layer 506 is formed, for example, by performing a chemical vapor deposition process using silicon nitride or other suitable stress material. The stress layer 506 has a stress between about 1 to 50 GPa. Preferably, the stress layer 506 has a stress between 1 to 10 GPa. Furthermore, the stress layer 506 has a thickness between about 100 Å to 2000 Å. Preferably, the stress layer 506 has a thickness between about 500 Å to 1500 Å. More preferably, the stress layer 506 has a thickness of about 1000 Å.

Figure 6:
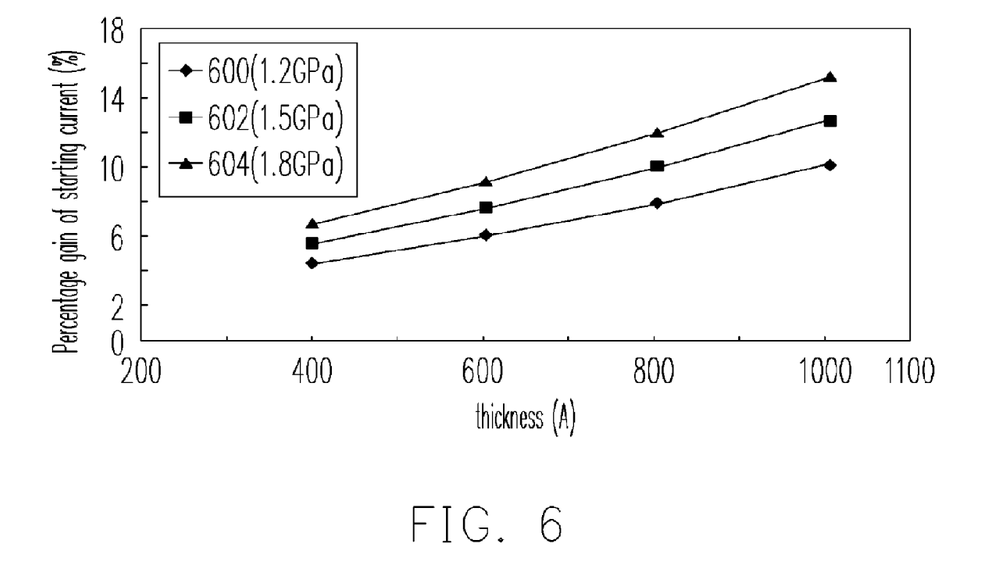
FIG. 6 is a graph showing the relation between the percentage gain of starting current versus the thickness of a stress layer.

It should be noted that the stress layer 506 could act on the channel region of the transistor to increase the driving current and enhance the performance capability of the device. Furthermore, the stress in the stress layer 506 is related to its thickness. If the thickness of the stress layer 506 is greater, the stress within the stress layer 506 will be higher and the driving current produced by the device will be larger. Therefore, the performance capability of the device is improved. In the following, the relation between the thickness of the stress layer and device performance is explained with respect to FIG. 6. FIG. 6 is a graph showing the relation between the percentage gain of starting current versus the thickness of a stress layer. In FIG. 6, the curves 600, 602 and 604 represent a stress value of 1.2 GPa, 1.5 GPa and 1.8 GPa in the stress layer with a thickness between 200 Å~1100 Å. As shown in FIG. 6, under the condition of a fixed stress value in the stress layer, the thicker the stress layer, the higher will be the percentage gain of the starting current of the device. That means, the driving current of the device is larger and the performance of the device is better. Due to the relationship between the device performance and the thickness of the stress layer, a thicker stress layer is normally formed to boost device performance. However, the problem caused by the seam 508 in the stress layer 506 will be intensified. Ultimately, subsequent processes may be affected.

Figure 5C:
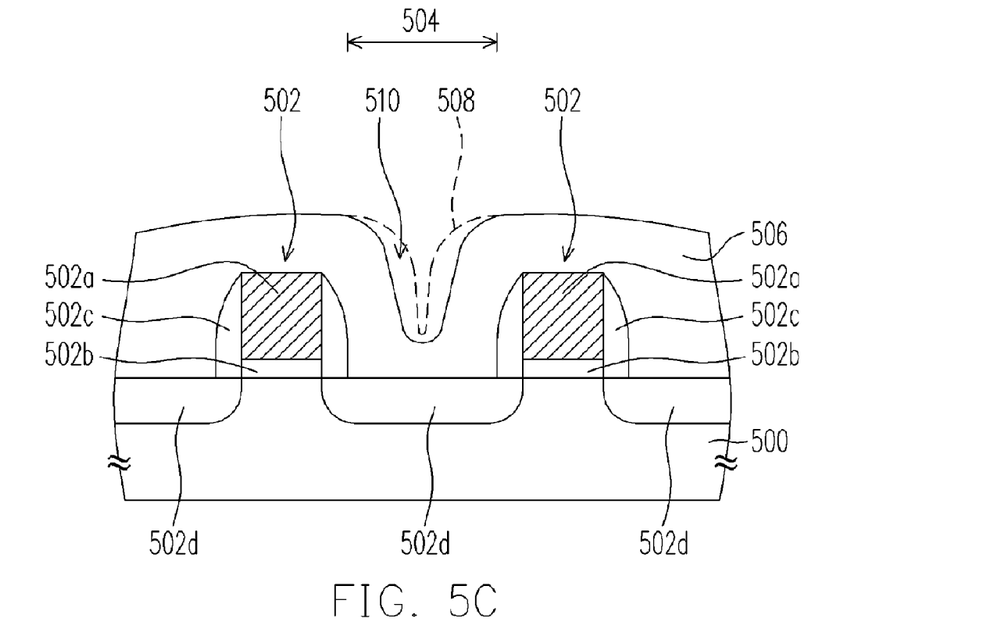

As shown in FIG. 5C, a portion of the stress layer 506 within the spacing 504 is removed to form an opening 510 so as to expand the width of the seam 508. The method of forming the opening 510 includes, for example, forming a photoresist layer (not shown) on the stress layer 506. Then, a photolithographic process is carried out to form a patterned photoresist layer 509 that exposes the seam 508 in the stress layer 506. Thereafter, using the patterned photoresist layer 509 as an etching mask layer, a portion of the stress layer 506 is etched to form the opening 510. Finally, the patterned photoresist layer 509 is removed.

In another embodiment, a bottom anti-reflective coating layer 507 is formed over the stress layer 506 before forming the photoresist layer. The bottom anti-reflective coating layer 407 can provide a smooth surface useful the photolithographic process is performed.

In another embodiment, the method of expanding the width of the seam 508 includes, for example, forming a photoresist layer (not shown) on the stress layer 506. Then, a photolithographic process is performed to form a patterned photoresist layer 509 that exposes the seam 508 in the dielectric layer 506. Thereafter, using the patterned photoresist layer 509 as an etching mask, a portion of the dielectric layer 506 is etched until the surface of the substrate 500 is exposed(not shown). Finally, the patterned photoresist layer is removed. In one embodiment, a bottom anti-reflection layer is formed over the stress layer 506 before forming the photoresist layer.

Figure 5D:
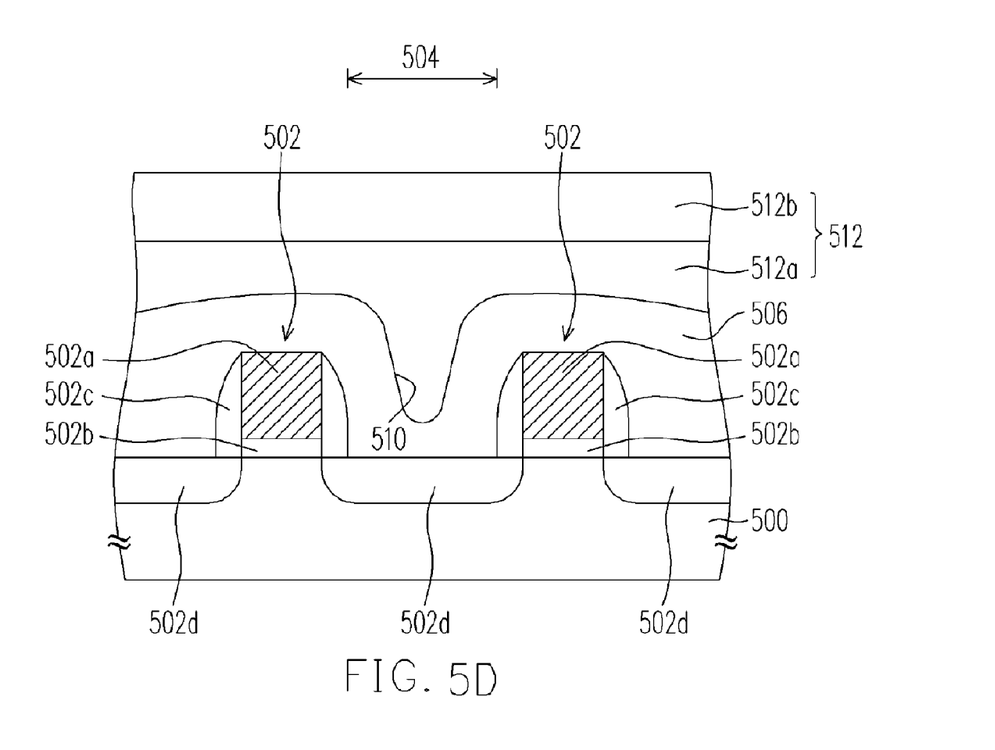

As shown in FIG. 5D, a dielectric layer 512 is formed over the stress layer 506 to fill the opening 510. In the present embodiment, the dielectric layer 512 comprises an undoped silicate glass layer 512a and a phosphosilicate glass layer 512b, for example. The dielectric layer 512 is formed, for example, by performing a sub-atmospheric chemical vapor deposition (SACVD) process to form an undoped silicate glass layer 512a on the stress layer 506. Then, using tetra-ethyl-ortho-silicate (TEOS) as a source of reactive gas, the phosphosilicate glass layer 512b is formed on the undoped silicate glass layer 512a. Alternatively, the dielectric layer 512 is fabricated using silicon oxide, phosphosilicate glass, borosilicate glass or borophosphosilicate glass and formed by performing a chemical vapor deposition process or other suitable processes, for example.

Figure 5E:
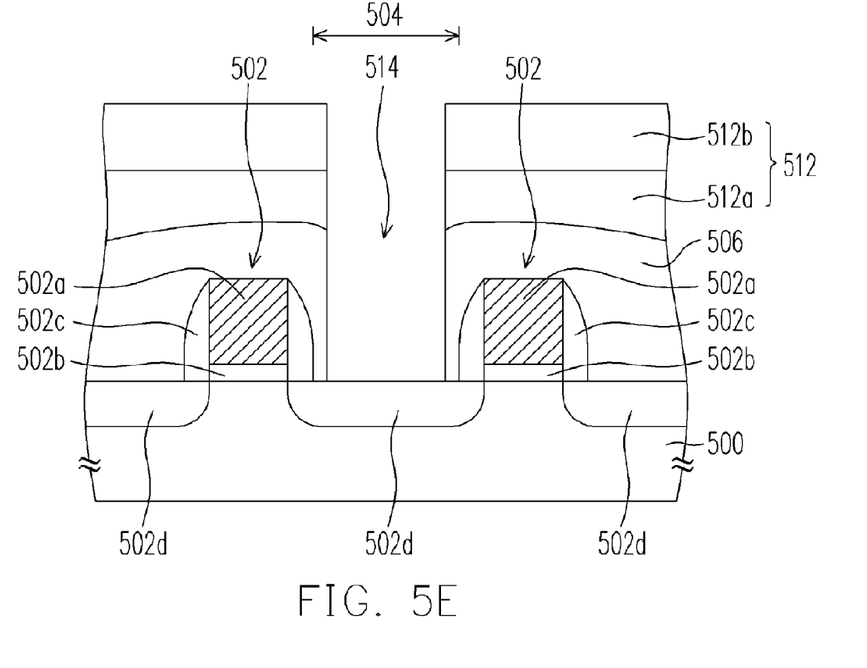

As shown in FIG. 5E, a portion of the dielectric layer 512 and a portion of the stress layer 506 within the spacing 504 are removed to expose a portion of the surface of the substrate 500 so that a contact opening 514 is formed in a corresponding opening 510. The contact opening 514 is formed, for example, by performing an etching operation.

Figure 5F:
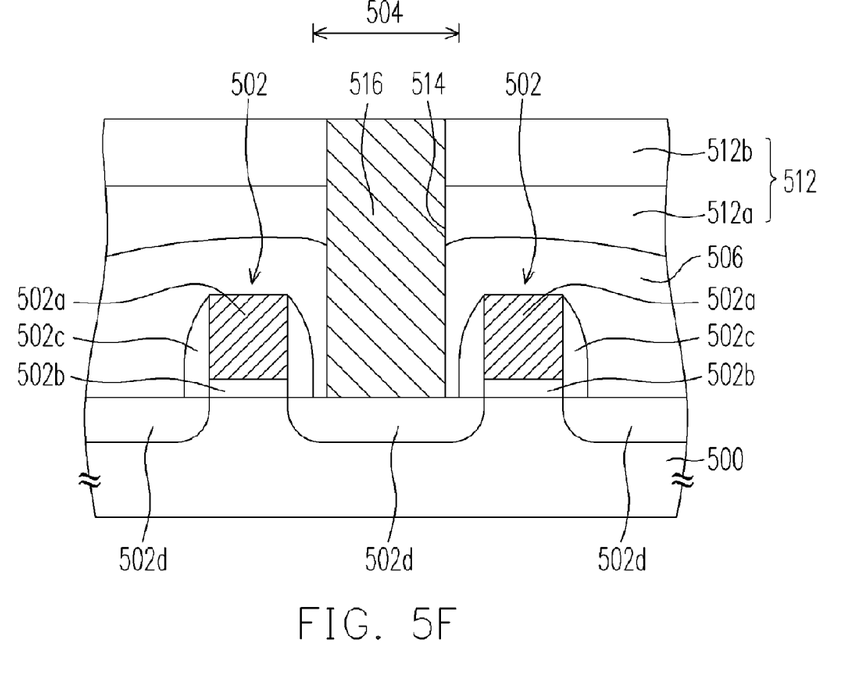

As shown in FIG. 5F, a conductive layer is filled into the contact opening 514 to serve as a contact 516. The conductive layer is fabricated using doped polysilicon material or tungsten and formed by performing a chemical vapor deposition process, for example.

It should be noted that a portion of the stress layer 506 has already been removed to expand the width of the seam before forming the contact opening 514. Hence, no residual material remains at the bottom of the contact opening 514. In other words, high resistance and device shorting problems that can affect the reliability can be avoided in the subsequent process for forming the contact 516.

In summary, the method of forming a contact according to the present invention includes at least the following advantages:

1. The method in the present invention can prevent the seam formed in a film layer between adjacent devices from affecting process reliability and device performance.

2. By expanding the width of the seam in the stress layer to prevent any residue deposited at the bottom of the contact opening in a subsequent process, the problems of having a high resistance in the contact and the possibility of short circuiting can be avoided.

3. The method in the present invention not only increases the thickness of the stress layer to increase the device performance, but also prevents the formation of a seam in the stress layer so that the effect on the reliability of the device is minimized.

4. Only one additional step in the process is required to form a thicker stress layer for increasing device performance and preventing the formation of a seam in the stress layer that might affect the reliability of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a contact, comprising:
    providing a substrate having at least two conductive devices, wherein a spacing is located between the two conductive devices;
    forming a first dielectric layer over the substrate to cover the two conductive devices and fill the spacing, wherein the first dielectric layer within the spacing has a seam;
    forming a pothoresist layer over the first dielectric layer;
    performing a photolithographic process to form a patterned photoresist layer that exposes the seam in the first dielectric layer;
    etching a portion of the first dielectric layer using the patterned photoresist layer as a mask to form an opening so as to expand the width of the seam;
    removing the patterned photoresist layer;
    forming a second dielectric layer over the first dielectric layer to fill the opening;
    removing a portion of the second dielectric layer and a portion of the first dielectric layer inside the spacing until a portion of the surface of the substrate is exposed so that a contact opening is formed in a location that corresponds to the opening; and
    filling a conductive layer into the contact opening.

2. The method of claim 1, wherein the material constituting the first dielectric layer comprises silicon nitride.

3. The method of claim 1, wherein the first dielectric layer has a thickness between 100 Å to 2000 Å.

4. The method of claim 1, wherein the first dielectric layer has a thickness between 500 Å to 1500 Å.

5. The method of claim 1, wherein the first dielectric layer has a thickness of 1000 Å.

6. The method of claim 1, wherein before forming the photoresist layer further comprises forming a bottom anti-reflective coating layer over the first dielectric layer.

7. The method of claim 1, wherein the material constituting the second dielectric layer comprises silicon oxide, phosphosilicate glass, borosilicate glass, borophosphosilicate glass or undoped silicate glass/phosphorus glass.

8. A method of forming a contact, comprising:
    providing a substrate having at least two metal-oxide-semiconductor (MOS) transistors, wherein a spacing is located between the two MOS transistors;
    forming a stress layer over the substrate to cover the two MOS transistors and fill the spacing, wherein the stress layer within the spacing has a seam;
    forming a photoresist layer over the stress layer;
    performing a photolithographic process to form a patterned photoresist layer that exposes the seam in the stress layer;
    etching a portion of the stress layer using the patterned photoresist layer as a mask to form an opening so as to expand the width of the seam;
    removing the patterned photoresist layer;
    forming a dielectric layer over the stress layer to fill the opening;
    removing a portion of the dielectric layer and a portion of the stress layer within the spacing until a portion of the surface of the substrate is exposed to form a contact opening in a position that corresponds to the opening; and
    filling a conductive layer into the contact opening.

9. The method of claim 8, wherein the material constituting the stress layer comprises silicon nitride.

10. The method of claim 8, wherein the stress layer has a stress between 1 to 50 GPa.

11. The method of claim 8, wherein the stress layer has a stress between 1 to 10 GPa.

12. The method of claim 8, wherein the stress layer has a thickness between 100 Å to 2000 Å.

13. The method of claim 8, wherein the stress layer has a thickness between 500 Åto 1500 Å.

14. The method of claim 8, wherein the stress layer has a thickness of 1000 Å.

15. The method of claim 8, wherein before forming the photoresist layer further comprises forming a bottom anti-reflective coating layer over the stress layer.

16. The method of claim 8, wherein the material constituting the dielectric layer comprises silicon oxide, phosphosilicate glass, borosilicate glass, borophosphosilicate glass or undoped silicate glass/phosphorus glass.

* * * * *